United States Patent
Bernoudy et al.

(10) Patent No.: US 11,567,779 B2
(45) Date of Patent: Jan. 31, 2023

(54) SYSTEMS AND METHODS FOR SIMULATION OF DYNAMIC SYSTEMS

(71) Applicant: D-WAVE SYSTEMS INC., Burnaby (CA)

(72) Inventors: William W. Bernoudy, Vancouver (CA); James A. King, Vancouver (CA); Andrew D. King, Vancouver (CA)

(73) Assignee: D-WAVE SYSTEMS INC., Burnaby (CA)

(*) Notice: Subject to any disclaimer, the term of this patent is extended or adjusted under 35 U.S.C. 154(b) by 426 days.

(21) Appl. No.: 16/817,210

(22) Filed: Mar. 12, 2020

(65) Prior Publication Data

US 2020/0293331 A1 Sep. 17, 2020

Related U.S. Application Data (60) Provisional application No. 62/817,694, filed on Mar. 13, 2019.

(51) Int. Cl.
*G06F 9/44* (2018.01)
*G06F 9/38* (2018.01)
(Continued)

(52) U.S. Cl.
CPC ............ *G06F 9/3879* (2013.01); *G06F 3/064* (2013.01); *G06F 3/0607* (2013.01);
(Continued)

(58) Field of Classification Search
CPC .................................................... G06F 9/3879
(Continued)

(56) References Cited

U.S. PATENT DOCUMENTS

| 5,576,958 A | 11/1996 | Kawakatsu et al. |
| 7,135,701 B2 | 11/2006 | Amin et al. |

(Continued)

FOREIGN PATENT DOCUMENTS

| WO | 03056512 A1 | 7/2003 |
| WO | 2009152180 A2 | 12/2009 |

(Continued)

OTHER PUBLICATIONS

Dickson et al., "Thermally Assisted Quantum Annealing of a 16-Qubit Problem," Nature Communications, 2013, 6 pages.

(Continued)

*Primary Examiner* — Timothy A Mudrick
(74) *Attorney, Agent, or Firm* — Cozen O'Connor (57) ABSTRACT

A highly parallelized parallel tempering technique for simulating dynamic systems, such as quantum processors, is provided. Replica exchange is facilitated by synchronizing grid-level memory. Particular implementations for simulating quantum processors by representing cells of qubits and couplers in grid-, block-, and thread-level memory are discussed. Parallel tempering of such dynamic systems can be assisted by modifying replicas based on isoenergetic cluster moves (ICMs). ICMs are generated via secondary replicas which are maintained alongside primary replicas and exchanged between blocks and/or generated dynamically by blocks without necessarily being exchanged. Certain refinements, such as exchanging energies and temperatures through grid-level memory, are also discussed.

20 Claims, 7 Drawing Sheets

(51) Int. Cl.
  *G06F 9/48* (2006.01)
  *G06F 3/06* (2006.01)
  *G06F 9/50* (2006.01)
  *G06F 30/20* (2020.01)

(52) U.S. Cl.
  CPC .......... *G06F 9/4843* (2013.01); *G06F 9/4881* (2013.01); *G06F 9/5016* (2013.01); *G06F 3/0688* (2013.01); *G06F 30/20* (2020.01)

(58) Field of Classification Search
  USPC .......................................................... 703/26
  See application file for complete search history.

(56) References Cited

U.S. PATENT DOCUMENTS

| | | | |
|---|---|---|---|
| 7,418,283 | B2 | 8/2008 | Amin |
| 7,533,068 | B2 | 5/2009 | Maassen et al. |
| 7,876,248 | B2 | 1/2011 | Berkley et al. |
| 7,984,012 | B2 | 7/2011 | Coury et al. |
| 8,008,942 | B2 | 8/2011 | Van et al. |
| 8,035,540 | B2 | 10/2011 | Berkley et al. |
| 8,073,808 | B2 | 12/2011 | Rose |
| 8,169,231 | B2 | 5/2012 | Berkley |
| 8,174,305 | B2 | 5/2012 | Harris |
| 8,175,995 | B2 | 5/2012 | Amin |
| 8,190,548 | B2 | 5/2012 | Choi |
| 8,195,586 | B2 | 6/2012 | Aoyama et al. |
| 8,195,596 | B2 | 6/2012 | Rose et al. |
| 8,421,053 | B2 | 4/2013 | Bunyk et al. |
| 8,452,576 | B2 * | 5/2013 | Reich ...................... G06F 30/20 703/2 |
| 8,977,576 | B2 | 3/2015 | Macready |
| 9,218,567 | B2 | 12/2015 | Macready et al. |
| 10,346,508 | B2 | 7/2019 | Amin et al. |
| 10,657,198 | B2 | 5/2020 | Amin et al. |
| 2003/0071258 | A1 | 4/2003 | Zagoskin et al. |
| 2008/0052055 | A1 | 2/2008 | Rose et al. |
| 2008/0109500 | A1 | 5/2008 | Macready et al. |
| 2008/0176750 | A1 | 7/2008 | Rose et al. |
| 2008/0260257 | A1 | 10/2008 | Rose |
| 2008/0313114 | A1 | 12/2008 | Rose |
| 2009/0121215 | A1 | 5/2009 | Choi |
| 2009/0167342 | A1 | 7/2009 | Van et al. |
| 2011/0022820 | A1 | 1/2011 | Bunyk et al. |
| 2011/0060710 | A1 | 3/2011 | Amin |
| 2011/0238607 | A1 | 9/2011 | Coury et al. |
| 2012/0023053 | A1 | 1/2012 | Harris et al. |
| 2012/0098594 | A1 | 4/2012 | Zmuidzinas et al. |
| 2013/0282636 | A1 | 10/2013 | Macready et al. |
| 2015/0161524 | A1 | 6/2015 | Hamze |
| 2015/0269124 | A1 * | 9/2015 | Hamze ................... G06N 20/00 703/2 |
| 2016/0364507 | A1 * | 12/2016 | Dupuis .................... G06F 30/20 |
| 2017/0177534 | A1 | 6/2017 | Mohseni et al. |
| 2018/0088647 | A1 | 3/2018 | Suryanarayanan et al. |
| 2019/0164059 | A1 * | 5/2019 | Denchev ................ G06N 3/126 |
| 2019/0220771 | A1 | 7/2019 | Boothby et al. |

FOREIGN PATENT DOCUMENTS

| | | |
|---|---|---|
| WO | 2010151581 A2 | 12/2010 |
| WO | 2012064974 A2 | 5/2012 |
| WO | 2013006836 A1 | 1/2013 |
| WO | 2016029172 A1 | 2/2016 |
| WO | 2017075246 A1 | 5/2017 |

OTHER PUBLICATIONS

Dickson, N.G. et al., "Algorithmic Approach to Adiabatic Quantum Optimization," Physical Review A 85(032303), 7 pages, 2012.
Bridges, M., et al., "A Bayesian analysis f the primordial power spectrum", The Authors. Journal compilation, 2006 RAS, MNRAS 369, pp. 1123-1130.
Cohen, Eliahu, et al., "Quantum Annealing—Foundations and Frontiers," arXiv:1408.5784v1, Aug. 25, 2014, 22 pages.
Hamze, "Sampling From a Set Spins With Clamping". U.S. Appl. No. 14/561,086, filed Dec. 4, 2014, 36 pages.
Hamze, "Sampling From a Set Spins With Clamping". U.S. Appl. No. 14/676,605, filed Apr. 1, 2015, 161 pages.
Hamze, "Sampling From a Set Spins With Clamping". U.S. Appl. No. 61/912,385, filed Dec. 5, 2013, 35 pages.
Mohseni, et al., "Nonequilibrium Monte Carlo for unfreezing variables in hard combinatorial optimization", arXiv:2111.13628v1 [cond-mat.dis-nn] Nov. 26, 2021, 28 pages.
Amin, "Effect of Local Minima on Adiabatic Quantum Optimization," Physical Review Letters 100(130503), 2008, 4 pages.
Choi, Vicky. "Minor-embedding in adiabatic quantum computation: I. The parameter setting problem." Quantum Information Processing 7.5 (2008): 193-209. (Year: 2008).
Albash, Tameem, et al., "Fluctuation theorems for quantum processes", Physical Review E, arXiv:1212.6589v4 [quant-ph], Sep. 30, 2013, 20 pages.
Amin, M.H. S, et al., "First Order Quantum Phase Transition in Adiabatic Quantum Computation", arXiv:0904.1387v3, Dec. 15, 2009, 5 pages.
Balicki, Jerzy, "An Adaptive Quantum-based Evolutionary Algorithm for Multiobjective Optimization", WSEAS Transactions on Systems and Control, Dec. 2009, 6 pages.
Dickson, Neil G, et al., "Algorithmic approach to adiabitic quantum optimization", Physical Review A, arXiv: 1108.3303v1 [puant-ph] Aug. 16, 2011, 7 pages.
Dickson, N. G, et al., "Thermally assisted quantum annealing of a 16-qubit problem", Nature communications, https://www.nature.com/articles/ncomms2920, May 21, 2013, 6 pages.
Fang, Ye, et al., "Parallel Tempering Simulation of the three-dimensional Edwards-Anderson Model with Compact Asynchronous Multispin Coding on GPU", Journal of Computational Physics, arXiv:1311.5582v1, [cond-mat.dis-nn] Nov. 21, 2013, 15 pages.
Farhi, Edward, et al., "Quantum Adiabatic Algorithms, Small Gaps, and Different Paths", Physical Review E, arXiv:0909.4766v2 [quant-ph], Jun. 4, 2010, 45 pages.
Geyer, Charles J, "Markov Chain Monte Carlo Maximum Likelihood", School of Statistics, UMN, 1999, https://www.stat.umn.edu/geyer/f05/8931/c.pdf, 8 pages.
Kirkland, Tom, et al., "Algorithms for automatic test-pattern generation", IEEExplore, Jun. 1988, https://ieeexplore.ieee.org/document/7962, 13 pages.
Kirkpatrick, S., et al., "Optimization by Simulated Annealing", Science Magazine, May 13, 1983, Science, New Series, vol. 2020, No. 9. 4598, pp. 6712-680.
Liu, Qiang, et al., "Stein Variational Gradient Descent: A General Purpose Bayesian Inference Algorithm", arXiv:1608.04471 [stat. ML], Aug. 19, 2016, 13 pages.
Liu, Jianjun, et al., "Weights Updated Voting for Ensemble of Neural Networks Based Incremental Learning", Advances in Neural Networks, 2009, https://link.springer.com/chapter/10.1007/978-3-642-01507-6_75, 2 pages.
Martonak, Roman, et al., "Quantum annealing of the travelling-salesman problem", Physical Review E, arXiv:cond-mat/0402330v1 [cond-mat.dis-nn], Feb. 12, 2004, 5 pages.
Neal, Radford M, "Annealed Importance Sampling", arXiv:physics/9803008 [physics.comp-ph], Sep. 4, 1998, 25 pages.
Nowotniak, R., et al., "GPU-based tuning of quantum-inspired genetic algorithm for a combinatorial optimization problem", Bulletin of the Polish Academy of Sciences, 2012, vol. 60, No. 2, 8 pages.
Raymond, Jack, et al., "Temperature Estimation for Annealers", Frontiers In ICT, Nov. 2016, vol. 3, Article 23, Nov. 7, 2016, 18 pages.
Swendsen, Robert H, et al., "Replica Monte Carlo Simulation of Spin-Glasses", Physical Review Letters vol. 57, No. 21, Nov. 24, 2986, 3 pages.
Yan, Kai, et al., "Kinetic Monte Carlo study of accelerated optimization problem search using Bose-Einstein condensates", IEICE Electronics Express, Progress in informatics, No. 8, 2011, pp. 39-47.

(56) References Cited

OTHER PUBLICATIONS

Zhang, Yichuan, et al., "Continuous Relaxations for Discrete Hamiltonian Monte Carlo", School of Informatic, University of Edinburgh, Dept of Engineering, University of Cambridge, United Kingdom, 9 pages.

Zhu, Zheng, et al., "Efficient Cluster Algorithm for Spin Glasses in Any Space Dimension", arXiv: 1501.05630 [cond-mat.dis-nn] Aug. 15, 2015, 5 pages.

* cited by examiner

FIGURE 6

SYSTEMS AND METHODS FOR SIMULATION OF DYNAMIC SYSTEMS

TECHNICAL FIELD

This disclosure generally relates to simulation of dynamic systems, and particularly to parallel tempering techniques.

BACKGROUND

Parallel tempering is a Markov-chain Monte Carlo (MCMC) technique sometimes used for simulation of dynamic systems (such as molecules), and/or for finding solutions to problems representable as such systems. Although conventional MCMC techniques involve simulating a dynamic system and changing its state through the application of update operations based on a temperature parameter, parallel tempering involves the simulation of multiple replicas of a dynamic system at different temperatures and exchanging replicas between different temperatures. This has been shown to improve mixing (and consequently overall performance) in suitable circumstances.

These benefits may be further improved for certain problem classes by specialized implementations of parallel tempering. An example of such an implementation is parallel tempering with isoenergetic cluster moves (PT-ICM), e.g. as described by Zhu et al., "Efficient Cluster Algorithm for Spin Glasses in Any Space Dimension", *Phys. Rev. Lett* 115, 077201 (2015), arXiv:1501.05630.

Parallel tempering has been implemented with highly parallelizable systems, such as systems comprising graphical processing units (GPUs). One such implementation is provided by Fang et al., "Parallel Tempering Simulation of the three-dimensional Edwards-Anderson Model with Compact Asynchronous Multispin Coding on GPU", arXiv: 1311.5582, albeit with limitations on the size of a system that may be effectively represented in parallel due to architectural considerations.

Certain dynamic systems, such as quantum processors having thousands of qubits, can be challenging to represent efficiently using existing parallel tempering techniques. There is thus a general desire for systems and methods for parallel tempering which allow for efficient computation of at least some complex dynamic systems.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

Aspects of the present disclosure provide systems and methods for simulating a dynamic system. The system comprises a processor in communication with non-transitory computer-readable medium. In some implementations, the processor comprises a graphical processing unit. The method is executed by the processor in communication with grid-level memory associated with a plurality of blocks and, for each block, a block-level memory associated with a plurality of threads.

The method comprises: instantiating a first replica of a representation of the dynamic system in a first block-level memory associated with a first block of the plurality of blocks; instantiating a second replica of a representation of the dynamic system in a second block-level memory associated with a second block of the plurality of blocks; updating the first replica based on a first temperature value according to an update operation; updating the second replica based on a second temperature value according to the update operation in parallel to the updating of the first replica; writing a first result to the grid-level memory based on the first replica; writing a second result to the grid-level memory based on the second replica; synchronizing the grid-level memory to make the first and second results available for reading by the first and second blocks; exchanging replicas between the first and second blocks synchronously by: reading the second result by the first block and updating the first block-level memory based on the second result; and reading the first result by the second block and updating the second block-level memory based on the first result; and writing a state of the dynamic system to the grid-level memory based on the first replica.

In some implementations, the dynamic system comprises a quantum processor having qubits and couplers and instantiating the first replica comprises representing, by each thread of the plurality of threads associated with the first block, a cell of the quantum processor, the cell comprising one or more qubits and one or more couplers.

In some implementations, the quantum processor comprises a plurality of instances of the cell regularly repeating across at least a portion of the quantum processor and updating the first replica comprises, for each thread of the first block, updating the cell in parallel with one or more other threads of the first block.

In some implementations, each thread corresponds to two or more cells and updating the first replica comprises, for each thread, updating the corresponding two or more cells.

In some implementations, representing, by each thread of the plurality of threads associated with the first block, a cell of the quantum processor comprises, for each thread associated with the first block, instantiating in thread-level memory associated with the thread a representation of the one or more qubits and one or more couplers of the cell.

In some implementations, updating the first replica comprises updating the first replica based on the representation in thread-level memory and the representation in block-level memory.

In some implementations, writing the second result to the grid-level memory comprises writing a measure of an energy of the dynamic system based on a state of the second replica to grid-level memory; and exchanging replicas between the first and second blocks comprises updating the first temperature value of the first block to equal the second temperature value of the second block based on the second result.

In some implementations, the method comprises: instantiating a first secondary replica corresponding to the first replica; updating the first secondary replica based on the first temperature according to the update operation; and modifying the first replica based on the secondary replica according to an isoenergetic cluster move operation.

In some implementations, the method comprises, before synchronizing the grid-level memory, writing a first state of the first secondary replica to grid-level memory; wherein exchanging replicas between the first and second blocks comprises reading a second state of the first secondary replica from grid-level memory to the first block-level memory.

In some implementations, the second state of the first secondary replica is generated based on a third secondary replica by a third block and the method comprises writing the second state from the third block to the grid-level memory.

In some implementations, the method comprises generating the first secondary replica based on an energy-preserving automorphism of the dynamic system.

In some implementations, the dynamic system comprises a quantum processor having a plurality of cells, each cell comprising qubits and couplers, the energy-preserving automorphism comprises a permutation of the plurality of cells, and generating the first secondary replica comprises permuting the cells of the first replica based on the permutation.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn are not necessarily intended to convey any information regarding the actual shape of the particular elements and may have been solely selected for ease of recognition in the drawings.

Figure 1:
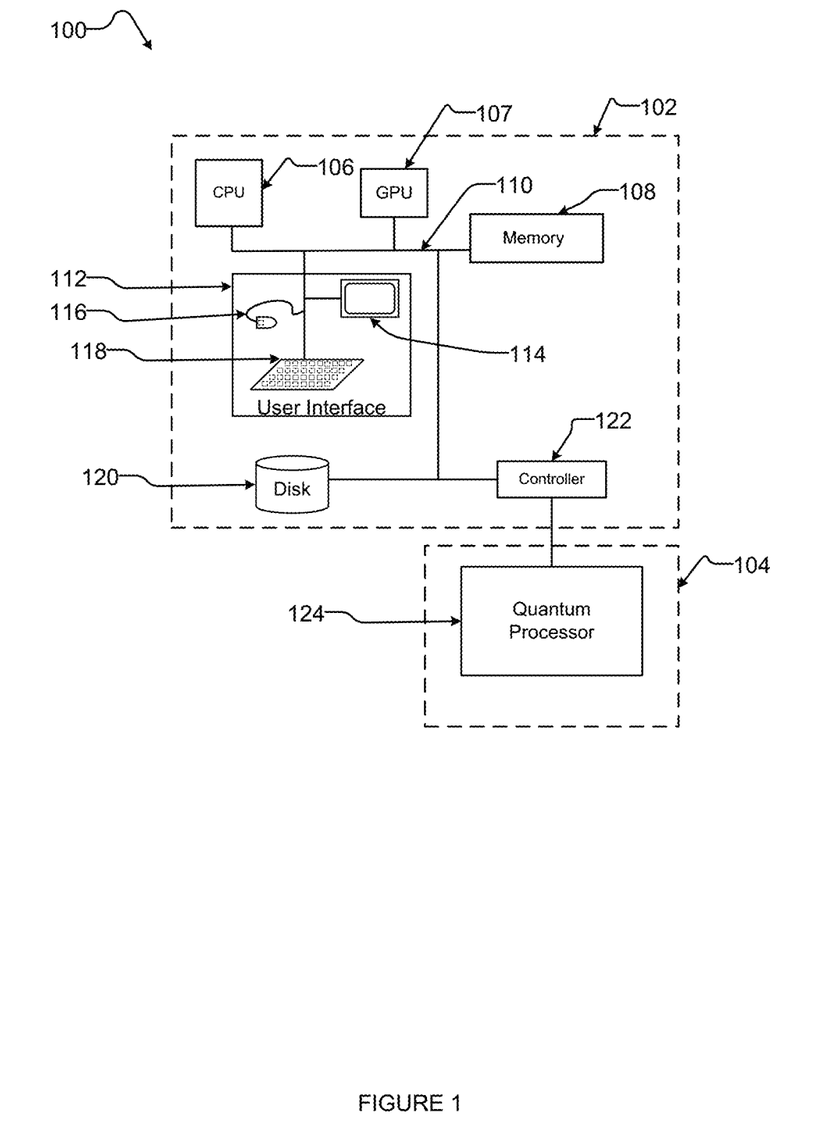

FIG. 1 is schematic of an example computing system for executing the methods disclosed herein.

Figure 2:
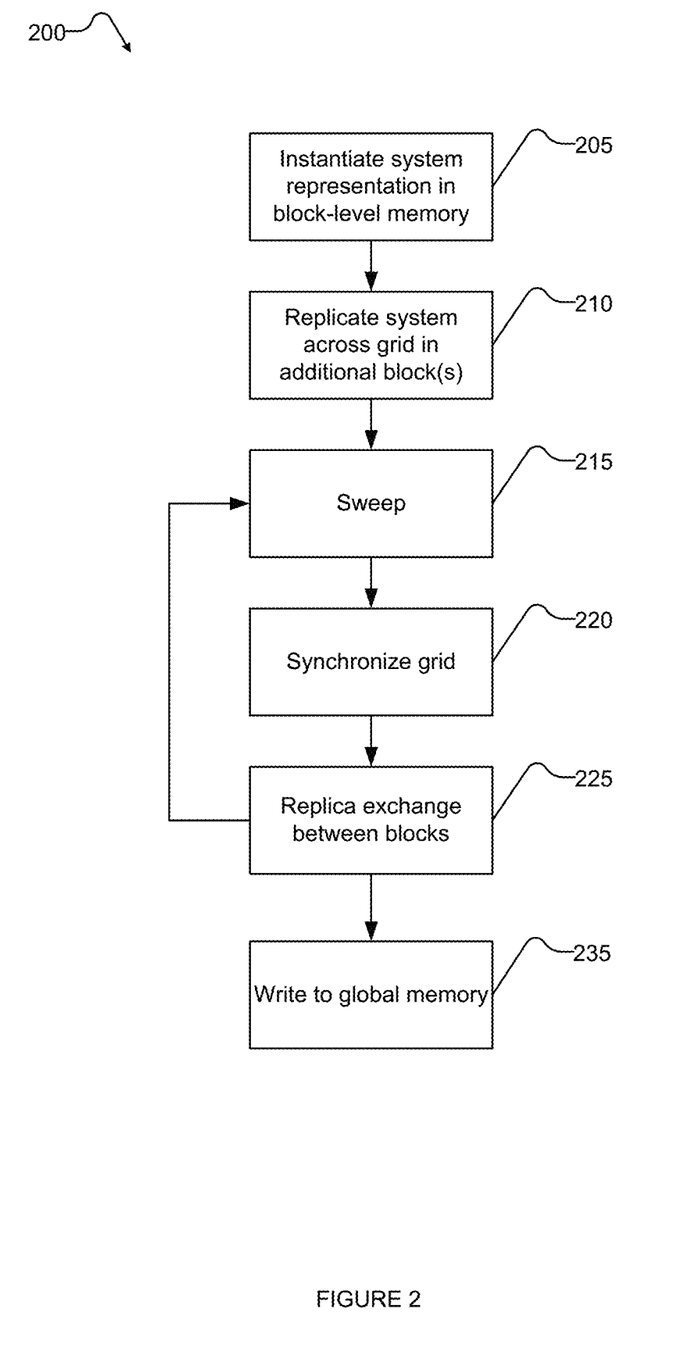

FIG. 2 is a flowchart of an example method for simulating a dynamic system with replica-level parallelization.

Figure 3A:
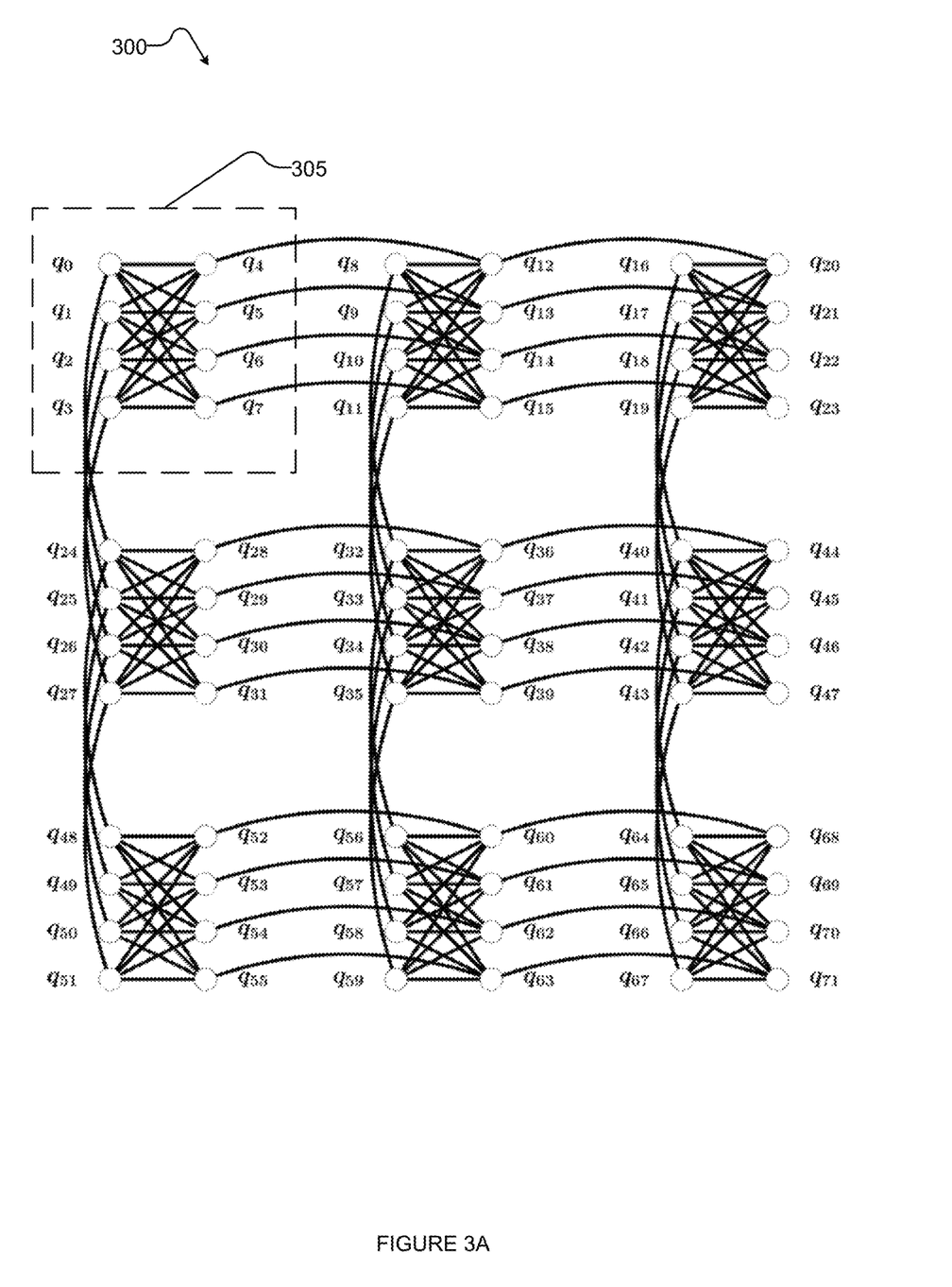

FIG. 3A is a schematic diagram of an example graph-based representation of an example quantum processor with a Chimera architecture.

Figure 3B:
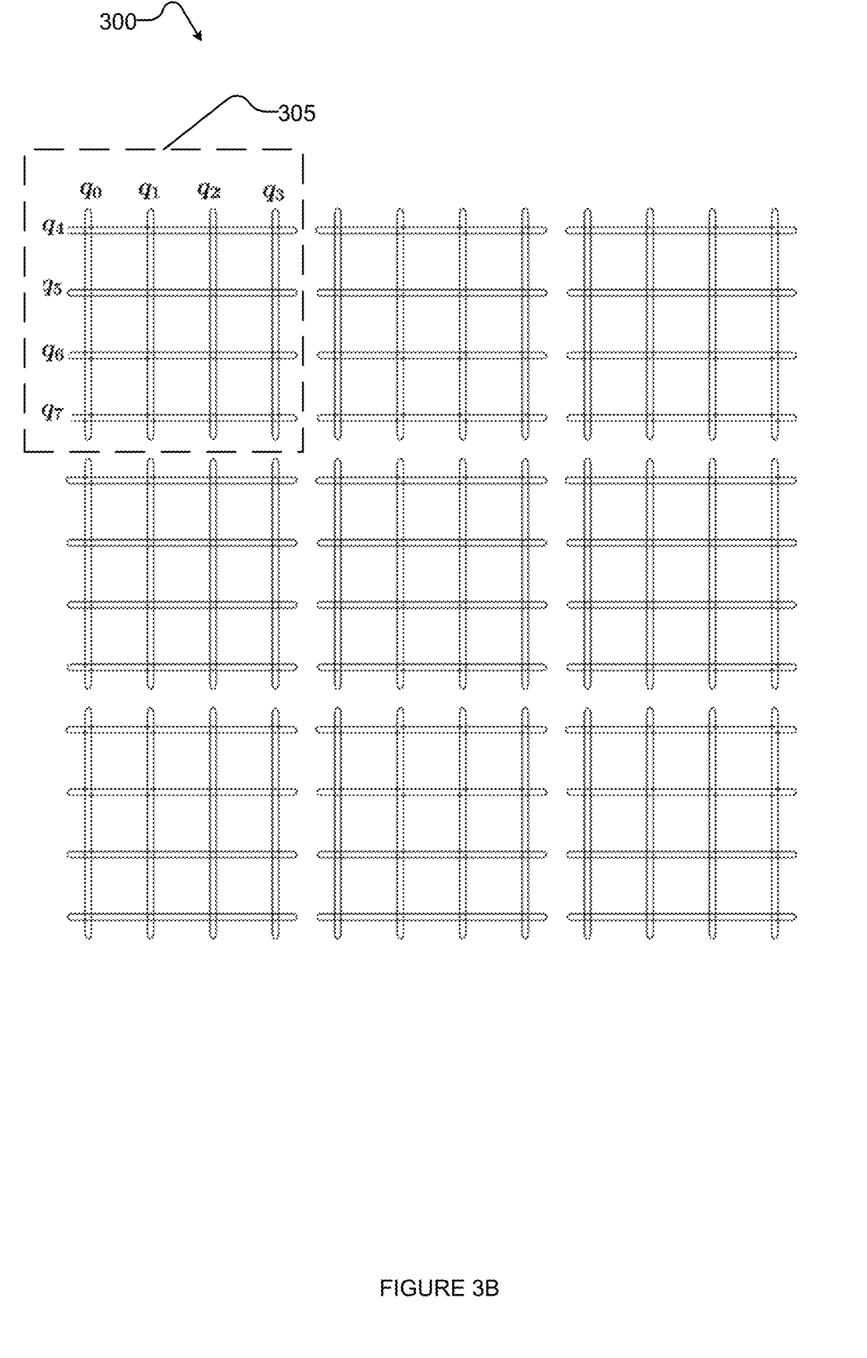

FIG. 3B is a schematic diagram of a topological representation of the example quantum processor of FIG. 3A.

Figure 4:
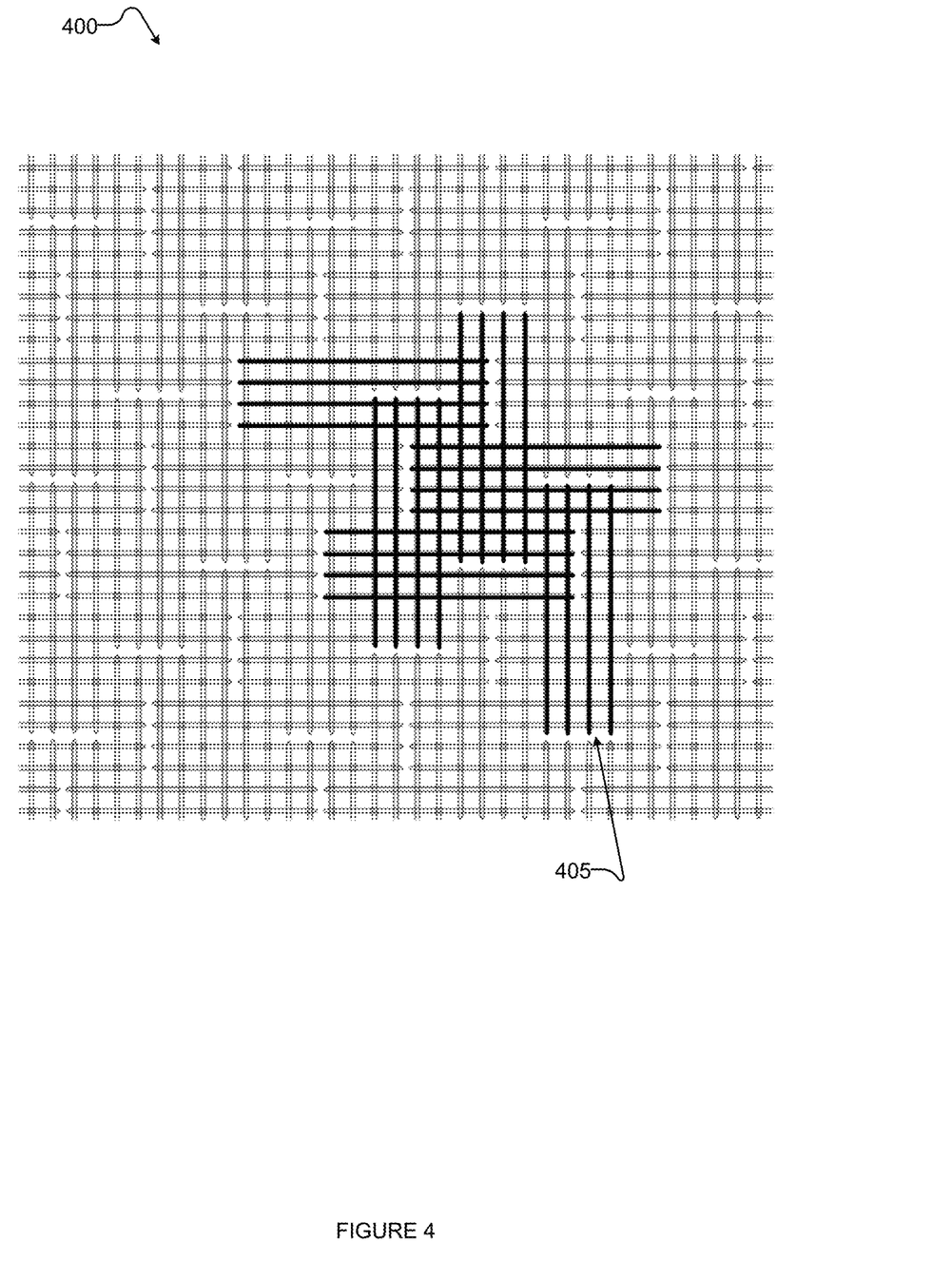

FIG. 4 is a schematic diagram of a topological representation of an example quantum processor with a Pegasus architecture.

Figure 5:
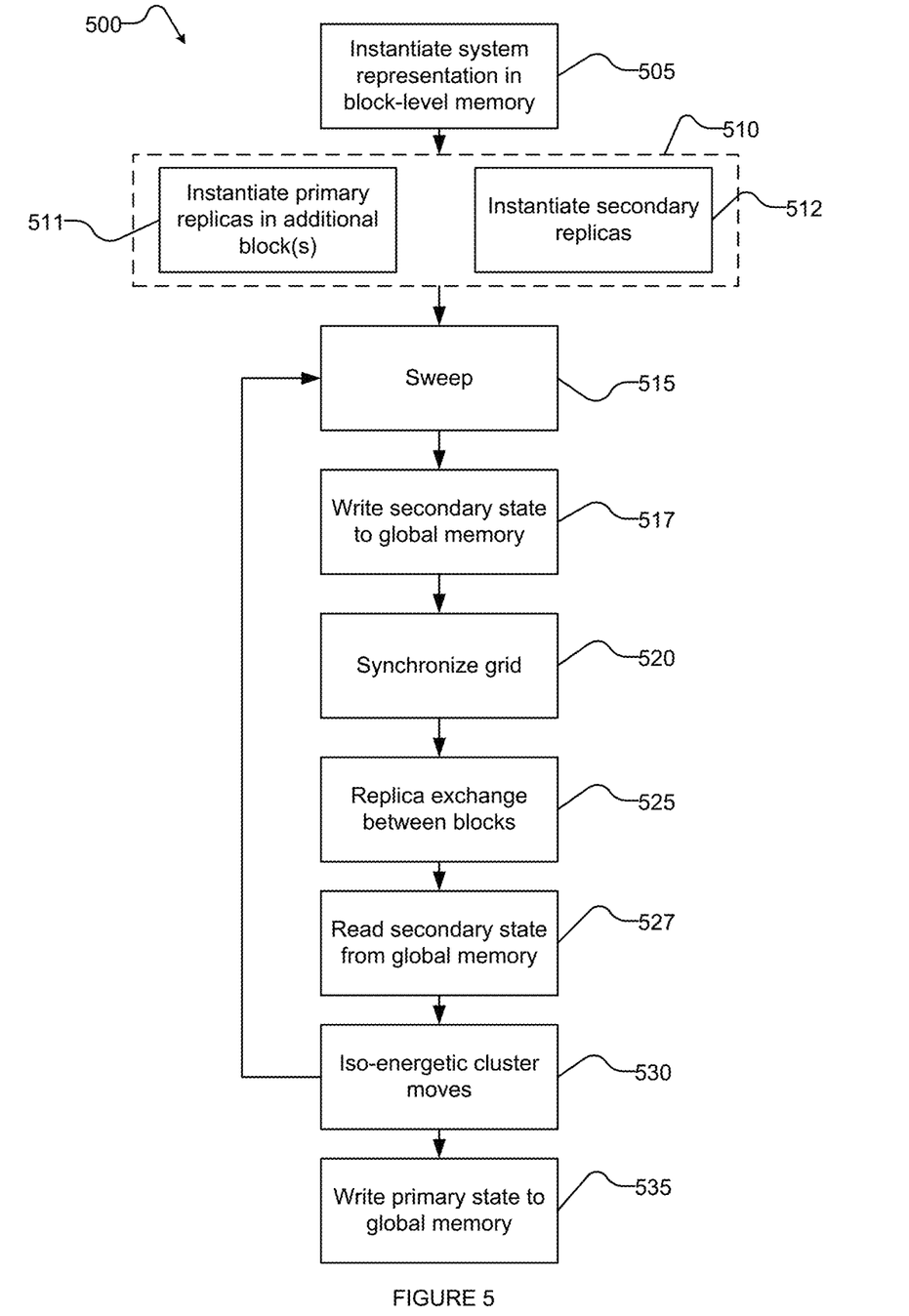

FIG. 5 is a flowchart of an example method for simulating a dynamic system with replica-level parallelization using isoenergetic cluster moves based on secondary replicas.

Figure 6:
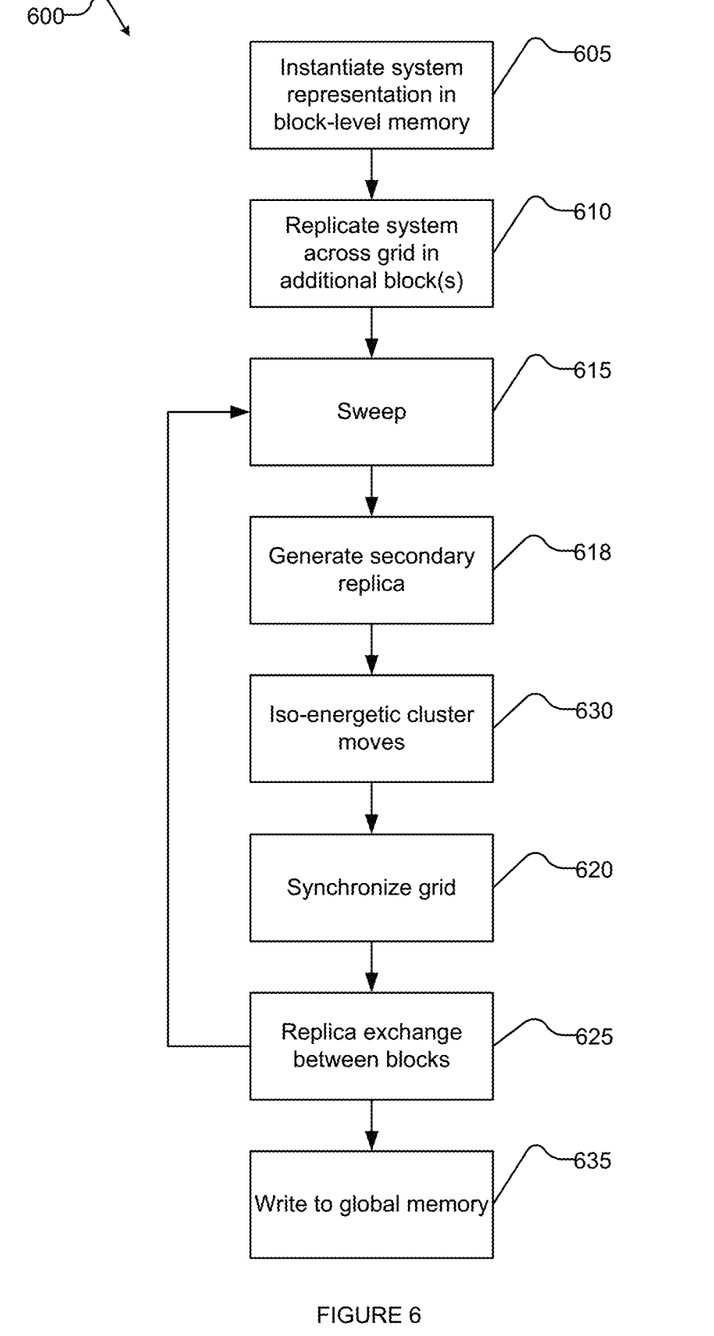

FIG. 6 is a flowchart of an example method for simulating a dynamic system with replica-level parallelization using isoenergetic cluster moves based on dynamic secondary replicas.

DETAILED DESCRIPTION in the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Aspects of the present disclosure provide techniques for parallel tempering which are adapted for efficient execution by GPUs and other highly parallelizable devices. A dynamic system, such as a quantum processor, is represented in block-level memory across a number of threads; each thread may process a regular component of the dynamic system, such as a unit cell of qubits. Replicas of the dynamic system are represented across one or more additional blocks across a grid in substantially the same way. Each thread then sweeps the states of the dynamic system's sub-components (e.g. qubits) according to a suitable parallel-tempering algorithm (e.g., via Metropolis and/or Gibbs sampling). Block-level memories are synchronized after the sweeps are completed, after which replicas are exchanged between blocks via global memory. In some implementations, replica states are modified via isoenergetic cluster moves.

Computing System

FIG. 1 illustrates an example computing system 100 including a classical computer 102. In some implementations computing system 100 is a hybrid quantum-classical computing system wherein classical computer 102 is coupled to a quantum computer 104. The example classical computer 102 includes a digital processor (CPU) 106 that may be used to perform classical digital processing tasks.

Classical computer 102 may include at least one digital processor (such as central processor unit 106 with one or more cores), at least one system memory 108, and at least one system bus 110 that couples various system components, including system memory 108 to central processor unit 106. The digital processor may be any logic processing unit, such as one or more central processing units ("CPUs"), graphics processing units ("GPUs", such as GPU 107), digital signal processors ("DSPs"), application-specific integrated circuits ("ASICs"), programmable gate arrays ("FPGAs"), programmable logic controllers (PLCs), etc.

Classical computer 102 may include a user input/output subsystem 112. In some implementations, the user input/output subsystem includes one or more user input/output components such as a display 114, mouse 116, and/or keyboard 118.

System bus 110 can employ any known bus structures or architectures, including a memory bus with a memory controller, a peripheral bus, and a local bus. System memory 108 may include non-volatile memory, such as read-only memory ("ROM"), static random-access memory ("SRAM"), Flash NANO; and volatile memory such as random-access memory ("RAM") (not shown).

Classical computer 102 may also include other non-transitory computer or processor-readable storage media or non-volatile memory 120. Non-volatile memory 120 may take a variety of forms, including: a hard disk drive for reading from and writing to a hard disk, an optical disk drive for reading from and writing to removable optical disks, and/or a magnetic disk drive for reading from and writing to magnetic disks. The optical disk can be a CD-ROM or DVD, while the magnetic disk can be a magnetic floppy disk or diskette. Non-volatile memory 120 may communicate with the digital processor via system bus 110 and may include appropriate interfaces or controllers 122 coupled to system bus 110. Non-volatile memory 120 may serve as long-term storage for processor- or computer-readable instructions, data structures, or other data (sometimes called program modules) for classical computer 102.

Although classical computer 102 has been described as employing hard disks, optical disks and/or magnetic disks, those skilled in the relevant art will appreciate that other types of non-volatile computer-readable media may be employed, such magnetic cassettes, flash memory cards, Flash, ROMs, smart cards, etc. Those skilled in the relevant art will appreciate that some computer architectures employ volatile memory and non-volatile memory. For example, data in volatile memory can be cached to non-volatile memory, or a solid-state disk that employs integrated circuits to provide non-volatile memory.

Various processor- or computer-readable instructions, data structures, or other data can be stored in system memory 108. For example, system memory 108 may store instruction for communicating with remote clients and scheduling use of resources including resources on the classical computer 102 and quantum computer 104, For example, the system memory 108 may store processor- or computer-readable instructions, data structures, or other data which, when executed by a processor or computer causes the processor(s) or computer(s) to execute one, more or all of the acts of the methods 200 (FIG. 2) and 300 (FIG. 3).

In some implementations system memory 108 may store processor- or computer-readable calculation instructions to perform pre-processing, co-processing, and post-processing to quantum computer 104. System memory 108 may store a set of quantum computer interface instructions to interact with the quantum computer 104.

Quantum computer 104 may include one or more quantum processors such as quantum processor 124. The quantum computer 104 can be provided in an isolated environment, for example, in an isolated environment that shields the internal elements of the quantum computer from heat, magnetic field, and other external noise (not shown). Quantum processors generally include programmable elements such as qubits, couplers and other devices. In accordance with the present disclosure, a quantum processor, such as quantum processor 124, may be designed to perform quantum annealing and/or adiabatic quantum computation. Example implementations of a quantum processor are described in U.S. Pat. No. 7,533,068.

Quantum-Scalable Parallel Tempering

In some implementations, classical computer 102 simulates a dynamic system, such as quantum processor 104. For example, classical computer 102 may attempt to determine an annealing schedule for a quantum processor 104, to determine by classical means a ground-energy state of a configuration of quantum processor 104, and/or to achieve some other end. Quantum processor 104 may be relatively complex, potentially comprising thousands of qubits and even more couplers. This can make efficient parallelization of such classical simulations challenging, as relatively few copies (or replicas) of a representation of quantum processor 104 can be implemented on classical computer 102.

FIG. 2 shows an example parallel tempering method 200 for enabling replica-level parallelization of complex dynamic systems in highly parallel hardware (e.g., a GPU). The highly-parallel hardware may have the ability to run many threads concurrently and may provide a tiered memory structure comprising thread-level memory (e.g., registers accessible only to the thread), block-level memory (e.g., memory shared by a set of threads within a block; this is sometimes called "shared" or "local" memory), and grid-level memory (e.g., memory shared by threads from multiple blocks; this is sometimes called "global" memory). A collection of blocks that share access to a pool of common memory is sometimes called a "grid". At 205, classical computer 102 instantiates a representation of the dynamic system in block-level memory. The representation of the dynamic system may be divided into a plurality of sub-representations, each of which is associated with a thread in the block.

For example, in some implementations classical computer 102 instantiates a representation of a quantum processor having qubits coupled by couplers. FIG. 3A shows schematically a graph-based representation of an example quantum processor 300. Quantum processor 300 has a so-called "Chimera" topology wherein an eight-qubit cell 305 has bipartite internal connectivity. Like cells are repeated over the processor (e.g., by tiling) with inter-cell couplings as shown. Cell 305 comprises qubits $q_0$-$q_7$, which in some implementations are physically laid out as depicted in FIG. 3B, which shows schematically a topological representation of an example implementation of quantum processor 300. Qubits $q_0$-$q_3$ extend along one dimension (e.g., shown horizontally) and qubits $q_4$-$q_7$ extend along another direction (e.g., shown vertically). Chimera topologies are described in greater detail by, for example, U.S. Pat. No. 8,421,053.

Other quantum processor topologies may be represented by classical computer 102. FIG. 4 shows schematically a topological representation of an example implementation of a quantum processor 400 using a so-called "Pegasus" topology. At a high level, a Pegasus topology may be represented as a set of cells, with each cell comprising a set of qubits having some internal topology (induced by couplings between those qubits), In some implementations, the structure of a given cell repeats across at least a portion of the quantum processor with identical and/or similar internal connectivity. There are several ways one can identify a cell in a Pegasus topology; one such cell is shown in FIG. 4 as cell 405. Cell 405 of the exemplary depicted Pegasus topology comprises 24 qubits (shown in bold), some of which are shifted relative to their neighbours. As FIG. 4 shows, Pegasus topologies tend to be considerably more complex than Chimera topologies; Pegasus topologies are described in greater detail by, for example, U.S. Patent Application Publication No. 2019/0220771.

The foregoing cells are exemplary in nature. It will be appreciated by those of skill in the art that a cell may comprise an arbitrary number and arrangement of qubits and couplers.

Returning to FIG. 2, in some implementations, classical computer 102 instantiates representations of the qubits of a cell, such as cell 305 and/or 405, in block-level memory of a block at act 205 of method 200 and processes the representations of qubits of cell 305, 405 in one thread of that block (at, e.g., acts 215, 220, and/or 225, discussed in greater detail below). Representations of qubits of other cells coupled to qubits of cell 305, 405 are instantiated in the same block-level memory, and may be processed in separate threads with like behavior. In some implementations, multiple cells are processed in one thread, and/or a cell may be processed by multiple threads, depending on (for example) the relative sizes of cells and thread-level registers. For convenience, we will say that the cell itself is associated with, represented by, and/or processed by a given thread (or threads) and block, understanding that the cell does not necessarily have any representation in block-level memory independent of its constituent qubits.

At 210, classical computer 102 replicates the dynamic system, such as quantum processor 300 and/or 400, such that at least one replica is represented in the memory of one block and another replica is represented in the memory of another block. A block represents one or more replicas of the dynamic system, with the number of replicas per block depending on the capacity of its block-level memory, the number of available threads in each block, and other factors. In some implementations, each block represents one replica. Each replica is an instantiation of a representation of the dynamic system as described in act 205. It will be understood that quantum processors having architectures different to those shown in FIGS. 3A, 3B, and 4 may similarly be instantiated and replicated and the methods described herein may similarly be applied.

At 215, for each replica, classical computer 102 updates the state of the dynamic system (as represented in memory) according to a suitable update operation, such as via the Metropolis-Hastings, Gibbs sampling, or any other technique now known or later developed. Updates may be done in parallel, e.g., with each block updating its associated replica. Each such update is sometimes called a "sweep" of the states. In some implementations, each thread associated with a replica of a quantum processor performs a sweep of a cell (i.e., a subset of qubits) of the quantum processor, storing the configuration of the cell in thread-level memory and updating the state of the replica in block-level memory. The thread may write information derived from the update (e.g., a measurement of the energy of the dynamic system post-sweep) to grid-level (e.g., global) memory.

For example, each thread may store in its local registers local bias terms (sometimes denoted h) for each qubit of an associated cell, coupling strengths (sometimes denoted J) of couplers coupled to qubits of the associated cell, and addresses of neighbouring qubits (i.e., qubits outside of the cell which are coupled to qubits in the cell). Addresses may include, for example, memory indices of qubits and/or qubit states in a block-level array.

The sweep operation may be performed by classical computer 102 based on a combination of the thread-level information (e.g., information describing the configuration of the dynamic system, such as qubit biases and coupling strengths) and block-level information (e.g., information describing the state of the dynamic system, such as qubit states).

At 220, classical computer 102 synchronizes a grid comprising at least two blocks, each block representing at least one replica and comprising one or more threads as described above. Synchronizing the grid prior to act 225 ensures that, even when blocks do not run concurrently (which is not generally guaranteed on many highly-parallelizable devices), grid-level (e.g., global) memory can be accessed synchronously by different blocks during replica exchange.

At 225, classical computer 102 performs replica exchange by passing information through grid-level memory. In some implementations, act 225 involves transferring state information between blocks so that a given block $b_1$ which formerly represented a replica with state $s_1$ now represents state $s_2$ (formerly of block $b_2$). This can involve passing a significant amount of information through global memory, which can be comparatively time-intensive. In some implementations, act 225 involves swapping temperatures between blocks to effect replica exchange; in at least some such implementations, state information is retained (i.e., not exchanged) between blocks. Replica exchange may be performed based on information in grid-level memory, such as the energies of each replica in its current state.

At 235 block-level information is written out to grid-level (e.g., global) memory. This may be done after each sweep or after a certain number of sweeps. In some implementations, each block is configured to perform K sweeps and to write out its state to grid-level memory after the $K^{th}$ sweep. In some implementations, K is also the number of sweeps between samples of the parallel tempering algorithm, so that only sampled states are written out to grid-level (e.g., global) memory.

An example implementation of the foregoing acts can be described in pseudocode as follows:

---

Algorithm 1: PT with replica-parallelism on GPU

---

Input : h, J ($C_L$ structured), B (list of inverse temperatures, length R)
Output: Samples
Initialize GPU with R blocks, each with $L^2$ threads
Allocate e as a global memory array to hold R energies
for each block with index b in parallel do
| // initialize variables
| Store h, J, and external neighbor indices for the thread's tile in registers
| main_rng ← RNG seeded uniquely to the block
| exch_rng ← RNG seeded by the same seed for all blocks
| st ← random state
| Allocate l as shared memory to hold R replica labels each
| for i ← 0 to R − 1 do
| |_ l[i] ← i
| for K iterations do
| | β ← $B_{l[b]}$
| | // sweep the states
| | st ← sweep(st, h, J, β, main_rng)
| | // write out the energies of the states
| | // (computed during sweep) to global memory
| | e[l[b]] ← E(st)
| | synchronize grid
| | // each block performs replica exchange
| | l ← replica_exchange(e, l, B, exch_rng)
|_ |_ Write st out to global memory as a sample after specified sweeps

Isoenergetic Cluster Moves

In some implementations, replicas are modified according to an isoenergetic cluster move technique (e.g., after replica exchange at 225). Any suitable isoenergetic cluster move technique can be used, for example as described by Zhu et al., *Efficient Cluster Algorithm for Spin Glasses in Any Space Dimension*, Phys. Rev. Lett. 115, 077201 (2015), arXiv:1501.05630 [cond-mat.dis-nn].

FIG. 5 shows a flowchart of an example parallel tempering method 500 for enabling replica-level parallelization of complex dynamic systems in highly parallel hardware (e.g., a GPU) using isoenergetic cluster moves. Act 505 is substantially similar to act 205 of FIG. 2. Act 510 comprises acts 511 and 512, each of which involve replicating the dynamic system substantially similarly to act 210. Act 511 instantiates a first set of replicas (called herein "primary replicas") for sampling and act 512 instantiates a second set of replicas (called herein "secondary replicas") for isoenergetic cluster moves with the primary replicas. Each primary of the sets of primary and secondary replicas are instantiated across blocks as described above with reference to act 210. In some implementations, each primary replica is paired with a secondary replica such that at least one block represents both a primary replica and its paired secondary replica.

At 515, classical computer 102 performs sweeps of the primary and secondary replicas. The primary and secondary replicas may each be swept in substantially the same way as described with reference to act 215.

At 517, classical computer 102 writes the state of at least one replica to grid-level (e.g. global) memory. In some implementations, such as the depicted implementation of FIG. 5, the state of the secondary replica is written to grid-level memory.

At 520, grid-level memory is synchronized substantially as described with reference to act 220. At 525, classical computer 102 performs replica exchange of the primary and secondary replicas. The primary and secondary replicas may each be exchanged with other primary and secondary replicas, respectively, in substantially the same was as described with reference to act 515. Primary and secondary replicas may be exchanged such that previously-paired replicas are assigned to different blocks.

At 527 a state written out by one block at 517 is read by another block. For example, in some implementations one or more blocks exchange secondary replicas at 525 and, at 527, those blocks read the states of their post-exchange replicas from grid-level memory and replace the pre-exchange replica states with the newly-read post-exchange replica states. The primary and secondary replicas of such blocks are now said to be paired.

At 530, classical computer 102 modifies the states of paired primary and secondary replicas according to an isoenergetic cluster move technique. An example implementation of an efficient isoenergetic cluster move technique for a quantum processor having a Chimera topology can be described in pseudocode as follows:

---

Algorithm 2: ICM

---

Input : $st_0$, $st_1$ (states stored in shared memory)
Output: $st_0$, $st_1$ (with a single flipped cluster)
Allocate C as shared memory array that will hold the cluster state
Allocate F as shared memory value that will store a flag
Let T be block size, the number of threads
Assumes external neighbor indices of each tile are in registers at $N^{inc}$ and $N^{dec}$
for each thread with index t in parallel do
|    $d \leftarrow \Sigma_{q=0}^{7}(st_0[8t + q] \oplus st_1[8t + q])$ // sum of state differences in tile
|    $r \leftarrow$ random qubit index (0-7) where states differ
|    $C[t] \leftarrow (t, d)$ // pair of t, d
|    synchronize threads
|    $s \leftarrow 2^{\lceil log2(T-1) \rceil}$ //parallel reduction to choose a random tile
|    while s > 0 do // where the cluster will starts
|      if t < s then
|        $(p_0, t_0) \leftarrow C(t)$
|        $(p_1, t_1) \leftarrow C[t + s]$
|        if uniform$(0, p_0 + p_1) > p_0$ then
|          $t_c \leftarrow t_1$
|        else
|          $t_c \leftarrow t_0$
|        $C[t] \leftarrow (t_c, p_0 + p_1)$
|      $s \leftarrow s/2$
|    $(t_c, \_) \leftarrow C[0]$ for $q \leftarrow$ 0 to 7 do
|      $C[8t + q] \leftarrow 0$
|    if $t = t_c$ then
|      $C[8t + q] \leftarrow 1$
|    F ← True
|    while F do // each tile now grows the cluster if it is connected
|      F ← False
|      v ← False
|      h ← False
|      for $q \leftarrow$ 0 to 7 do // checks if qubit q is part of the cluster
|        if $C[8t + q] = 1$ and $(st_0[8t + q] \oplus st_1[8t + q]) = 1$ then
|          if q is horizontal qubit index then
|            v = True
|          else
|            h = True
|          $C[N_q^{inc}] \leftarrow st_0[N_q^{inc}] \oplus st_1[N_q^{inc}]$ // add external neighbors to cluster
|          $C[N_q^{dec}] \leftarrow st_0[N_q^{dec}] \oplus st_1[N_q^{dec}]$ // if their states differ
|    if v then // a horizontal qubit was added, so check all verticals
|      for q in vertical qubit indices do
|        $C[8t + q] \leftarrow st_0[8t+q] \oplus st_1[8t + q]$ -continued Algorithm 2: ICM

```
|   |   if h then  // a vertical qubit was added, so check all horizontals
|   |   |   for q in horizontal qubit indices do
|   |   |_  |_   C[8t + q] ← st₀[8t+q] ⊕ st₁[8t + q]
|   |   if v or h then
|   |   |_   F ← True
|   |_  synchronize threads
|   for q ← 0 to 7 do  // finally, flip the states if the qubit belongs to cluster
|   |   st₀[8t + q] = st₀[8t + q] ⊕ C[8t +q]
|_  |_  st₁[8t + q] = st₁[8t + q] ⊕ C[8t +q]
```

At 535 the state of at least the primary replicas is written to grid-level memory substantially as described with reference to act 235. An example implementation of the acts of method 500 can be described in pseudocode as follows:

Algorithm 3: PT-ICM

```
Input : h, J (C_L structured), B (list; of inverse temperatures, length R)
Output: Samples
Initialize GPU with R blocks, each with L² threads
Allocate S as a global memory array to hold R states
Allocate e, ê as a global memory arrays to hold R energies each
for each block with index b in parallel do
|   // initialize needed variables
|   Store h, J, and external neighbor indices for the thread's tile in registers
|   st₀ ← random state
|   st₁ ← random state
|   Allocate l and l̂ as shared memory to hold R replica labels each
|   for i ← 0 to R − 1 do
|   |   l[i] ← i
|   |_  l̂[i] ← i
|   for K iterations do  // perform PT sweeps
|   |   β ← B_l[b]
|   |   st₀ ← sweep(st₀, h, J, β)  // sweep the states with Metropolis or Gibbs
|   |   st₁ ← sweep(st₁, h, J, β)  // each threat will handle a Chimera tile
|   |   e[l[b]] ← E(s0)  // write out the energies of the states
|   |   ê[l̂[b]] ← E(s1)  // (computed during sweep) to global memory
|   |   // write the second state to global memory at
|   |   // at the corresponding index
|   |   S[l̂[b]] ← st₁
|   |   synchronize grid
|   |   l ← replica_exchange(e, l, B)  // exchange the two columns of replicas
|   |   l̂ ← replica_exchange(ê, l̂, B)  // this updates the label lists l and l̂
|   |   // grab the corresponding second replica from global states
|   |   st₁ ← S[l̂[b]]
|   |   for i ← 0 to R − 1 do  // reset the second column replicas
|   |   |_   l̂[i] ← l[i]
|   |   st₀, st₁ ← ICM(st₀, st₁)
|_  |_  Write st₀ out to global memory as a sample after sweeps
```

Dynamic Secondary Replicas

Isoenergetic cluster moves can provide significant advantages over certain dynamic systems and in certain contexts. Maintaining secondary replicas with which to perform isoenergetic cluster moves incurs significant costs in terms of time and/or memory. In some implementations, classical computer 102 generates secondary replicas dynamically based on an automorphism of the primary replicas. This can allow classical computer 102 to mitigate or avoid the need to sweep or exchange secondary replicas, potentially reducing the costs of applying isoenergetic cluster moves.

FIG. 6 shows a flowchart of an example parallel tempering method 600 for enabling replica-level parallelization of complex dynamic systems in highly parallel hardware (e.g., a GPU) using dynamically-generated secondary replicas to perform isoenergetic cluster moves. Acts 605, 610, and 615 are substantially similar to acts 205, 210, and 215 of method 200, respectively.

At 618, classical computer 102 generates a secondary replica based on the primary replica (generated at 610 and swept at 615). In some implementations, the secondary replica is generated based on an automorphism of the dynamic system. In at least some embodiments, the automorphism preserves the energy of the dynamic system. For example, in implementations where the dynamic system is a quantum processor, the automorphism may comprise an automorphism that keeps qubit biases and coupler strengths invariant under cell-wise translation of the quantum processor's topology. For quantum processors which implement an Ising system, such automorphisms may comprise permutations of one or more cells of the quantum processor's topology (which are relatively efficient to compute). Any suitable energy-preserving automorphism may be used; for example, automorphisms for a particular dynamic system may be pre-computed, received from a user and/or cache, and/or otherwise obtained.

The elements of the secondary replica may be stored simultaneously in memory. However, in some implementations, the secondary replica is generated on an as-needed basis such that the whole secondary replica is not stored entirely in memory simultaneously (e.g., each cell may be generated independently at the time it is needed). In some implementations, the secondary replica is not a complete replica of the dynamic system; for example, the secondary replica may comprise candidates for cluster sites and may, optionally, exclude portions of the dynamic system which are not candidates for cluster sites.

At 630, classical computer 102 performs isoenergetic cluster moves between the primary and secondary replicas. This can be done as described herein (e.g., with reference to 530) or as otherwise known in the art. In some implementations, classical computer 102 performs isoenergetic cluster moves by identifying a set of connected components in the disjoint union of the primary and secondary replicas (i.e., $S_r \oplus S_r'$ where $S_r$ is the primary replica and $S_r'$ is the secondary replica), choosing a subset of those components according to an update rule, and creating a new state by inverting the state of each spin in the primary replica that is also in one of the selected components.

Acts 620, 625 and 635 are substantially similar to acts 220, 225, and 235 of method 200. In some implementations, acts 618 and 630 are performed less frequently than act 615. For example, acts 618 and 630 may be performed every k sweeps, where k is some positive integer greater than 1. An example implementation of the acts of method 600 can be described in pseudocode as follows:

---

Algorithm 4: PT-ICM by Applying Automorphisms

---

Input : h, J (with a periodic lattice topology and where h and J are invariant
    under tile translation), B (list of inverse temperatures, length R),
    num_sweeps
Output: Samples
Meta-parameters: m (number of saved automorphisms), k (how often to apply
               ICMs), U (ICM update rule)
Initialize R random states and store in array S
Generate m field-and-coupler-preserving automorphisms and store in A
for num_sweeps do
    |    for r in R do
    |    |    Perform a Gibbs/Metropolis sweep on state at $S_r$ at β = B[r]
    |    |    every kth sweep
    |    |    |    Apply a random automorphism a ∈ A to generate state $S'_r$
    |    |    |    Perform an ICM on $S_r$ and $S'_r$:
    |    |    |        Identify the set of connected components in $S_r \oplus S'_r$
    |    |    |        Choose a subset of these components according to U
    |    |    |        Create a new state s by flipping the state of each spin in $S_r$ that is
    |    |    |           also in one of the selected components
    |    |_   |_   $S_r \leftarrow s$
    |_   Exchange states S according to standard PT exchange rule
return collected samples

---

The above described method(s), process(es), or technique(s) could be implemented by a series of processor readable instructions stored on one or more nontransitory processor-readable media. Some examples of the above described method(s), process(es), or technique(s) are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, although those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to:

U.S. Patent Application Publication No. 2019/0220771, U.S. Pat. Nos. 7,533,068 and 8,421,053; and U.S. Provisional Application No. 62/817,694.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A method for simulating a dynamic system, the method executed by at least one processor in communication with grid-level memory associated with a plurality of blocks and, for each block, a block-level memory associated with a plurality of threads, the method comprising:
    instantiating a first replica of a representation of the dynamic system in a first block-level memory associated with a first block of the plurality of blocks;

instantiating a second replica of a representation of the dynamic system in a second block-level memory associated with a second block of the plurality of blocks;
updating the first replica based on a first temperature value according to an update operation;
updating the second replica based on a second temperature value according to the update operation in parallel to the updating of the first replica;
writing a first result to the grid-level memory based on the first replica;
writing a second result to the grid-level memory based on the second replica;
synchronizing the grid-level memory to make the first and second results available for reading by the first and second blocks;
exchanging replicas between the first and second blocks synchronously by:
reading the second result by the first block and updating the first block-level memory based on the second result; and
reading the first result by the second block and updating the second block-level memory based on the first result; and
writing a state of the dynamic system to the grid-level memory based on the first replica.

2. The method of claim 1 wherein the dynamic system comprises a quantum processor having qubits and couplers and instantiating the first replica comprises representing, by each thread of the plurality of threads associated with the first block, a cell of the quantum processor, the cell comprising one or more qubits and one or more couplers.

3. The method of claim 2 wherein the quantum processor comprises a plurality of instances of the cell regularly repeating across at least a portion of the quantum processor and updating the first replica comprises, for each thread of the first block, updating the cell in parallel with one or more other threads of the first block.

4. The method of claim 3 wherein each thread corresponds to two or more cells and updating the first replica comprises, for each thread, updating the corresponding two or more cells.

5. The method of claim 2 wherein representing, by each thread of the plurality of threads associated with the first block, a cell of the quantum processor comprises, for each thread associated with the first block, instantiating in thread-level memory associated with the thread a representation of the one or more qubits and one or more couplers of the cell.

6. The method of claim 5 wherein updating the first replica comprises updating the first replica based on the representation in thread-level memory and the representation in block-level memory.

7. The method of claim 1 wherein:
writing the second result to the grid-level memory comprises writing a measure of an energy of the dynamic system based on a state of the second replica to grid-level memory; and
exchanging replicas between the first and second blocks comprises updating the first temperature value of the first block to equal the second temperature value of the second block based on the second result.

8. The method of claim 1 comprising:
instantiating a first secondary replica corresponding to the first replica;
updating the first secondary replica based on the first temperature according to the update operation; and
modifying the first replica based on the secondary replica according to an isoenergetic cluster move operation.

9. The method of claim 8 comprising, before synchronizing the grid-level memory, writing a first state of the first secondary replica to grid-level memory; wherein exchanging replicas between the first and second blocks comprises reading a second state of the first secondary replica from grid-level memory to the first block-level memory.

10. The method of claim 9 wherein the second state of the first secondary replica is generated based on a third secondary replica by a third block and the method comprises writing the second state from the third block to the grid-level memory.

11. The method of claim 8 comprising generating the first secondary replica based on an energy-preserving automorphism of the dynamic system.

12. The method of claim 11 wherein the dynamic system comprises a quantum processor having a plurality of cells, each cell comprising qubits and couplers, the energy-preserving automorphism comprises a permutation of the plurality of cells, and generating the first secondary replica comprises permuting the cells of the first replica based on the permutation.

13. A computing system comprising:
at least one processor;
at least one nontransitory processor-readable medium communicatively coupled to the at least one processor, the at least one nontransitory processor-readable medium storing at least one of processor-executable instructions or data which, when executed by the at least one processor, cause the at least one processor to:
instantiate a first replica of a representation of a dynamic system in a first block-level memory associated with a first block of the plurality of blocks;
instantiate a second replica of a representation of the dynamic system in a second block-level memory associated with a second block of the plurality of blocks;
update the first replica based on a first temperature value according to an update operation;
update the second replica based on a second temperature value according to the update operation in parallel to the updating of the first replica;
write a first result to the grid-level memory based on the first replica;
write a second result to the grid-level memory based on the second replica;
synchronize the grid-level memory to make the first and second results available for reading by the first and second blocks;
exchange replicas between the first and second blocks synchronously by:
reading the second result by the first block and updating the first block-level memory based on the second result; and
reading the first result by the second block and updating the second block-level memory based on the first result; and
write a state of the dynamic system to the grid-level memory based on the first replica.

14. The computing system of claim 13 wherein the processor comprises a graphical processing unit.

15. The computing system of claim 13, wherein the dynamic system comprises a quantum processor having qubits and couplers and the at least one of processor-executable instructions or data cause the at least one processor to instantiate the first replica by representing a cell of the quantum processor with each thread of the plurality of threads associated with the first block, the cell comprising one or more qubits and one or more couplers.

16. The computing system of claim 15, wherein the quantum processor comprises a plurality of instances of the cell regularly repeating across at least a portion of the quantum processor and the at least one of processor-executable instructions or data cause the at least one processor to, for each thread of the first block, update the first replica by updating the cell in parallel with one or more other threads of the first block.

17. The computing system of claim 16, wherein each thread corresponds to two or more cells and the at least one of processor-executable instructions or data cause the at least one processor to update the corresponding two or more cells for each thread.

18. The computing system of claim 15, wherein the at least one of processor-executable instructions or data cause the at least one processor to, for each thread associated with the first block, instantiate in thread-level memory associated with the thread a representation of the one or more qubits and one or more couplers of the cell.

19. The computing system of claim 18, wherein the at least one of processor-executable instructions or data cause the at least one processor to update the first replica based on the representation in thread-level memory and the representation in block-level memory.

20. The computing system of claim 13, wherein the at least one of processor-executable instructions or data cause the at least one processor to write a measure of an energy of the dynamic system based on a state of the second replica to grid-level memory and update the first temperature value of the first block to equal the second temperature value of the second block based on the second result.

* * * * *